(12) United States Patent
Saino

(10) Patent No.: US 7,772,099 B2
(45) Date of Patent: Aug. 10, 2010

(54) METHOD FOR MANUFACTURING A SEMICONDUCTOR DEVICE HAVING A DOPED SILICON FILM

(75) Inventor: Kanta Saino, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 656 days.

(21) Appl. No.: 11/765,145

(22) Filed: Jun. 19, 2007

(65) Prior Publication Data
US 2007/0298597 A1 Dec. 27, 2007

(30) Foreign Application Priority Data
Jun. 20, 2006 (JP) .............................. 2006-169765

(51) Int. Cl.
H01L 21/425 (2006.01)
(52) U.S. Cl. ........... 438/527; 257/E21.66; 257/E21.678
(58) Field of Classification Search ................ 438/199, 438/514, 527; 257/E21.623, E21.637, E21.678, 257/E21.66, E21.683, E21.689
See application file for complete search history.

(56) References Cited

U.S. PATENT DOCUMENTS 6,063,669 A * 5/2000 Takaishi .................... 438/270
6,281,050 B1 * 8/2001 Sakagami ................... 438/142
6,350,654 B1 * 2/2002 Sheu et al. .................. 438/278

FOREIGN PATENT DOCUMENTS

| JP | 9-283637 | 10/1997 |
| JP | 11-307765 | 11/1999 |
| JP | 2000-208640 | 7/2000 |

OTHER PUBLICATIONS

J.Y. Kim, et al., "The Breakthrough in data retention time of DRAM using Recess-Channel-Array Transistor (RCAT) for 88nm feature size and beyond," Symposium on VLSI Technology, pp. 11-12, Jun. 2003.

* cited by examiner

Primary Examiner—David Vu
(74) Attorney, Agent, or Firm—Scully, Scott, Murphy & Presser, P.C.

(57) ABSTRACT

A method for manufacturing a semiconductor device includes the step of depositing a doped silicon layer doped with a first-conductivity-type dopant and a non-doped silicon layer to form a layered silicon film, implanting a first-conductivity-type dopant into a portion of the layered silicon film disposed in a first region, implanting a second-conductivity-type dopant into a portion of the layered silicon film disposed in a second region, and heat treating the layered silicon film to form a first-conductivity-type silicon film in the first region and a second-conductivity-type silicon film in the second region.

5 Claims, 5 Drawing Sheets

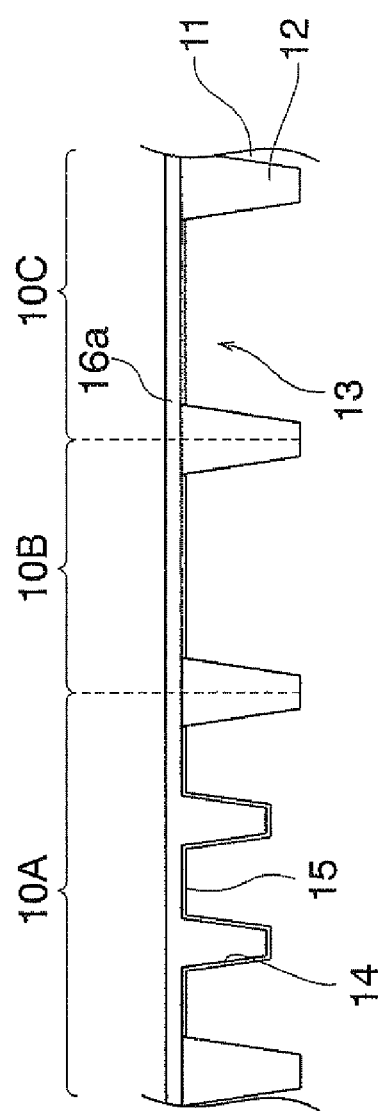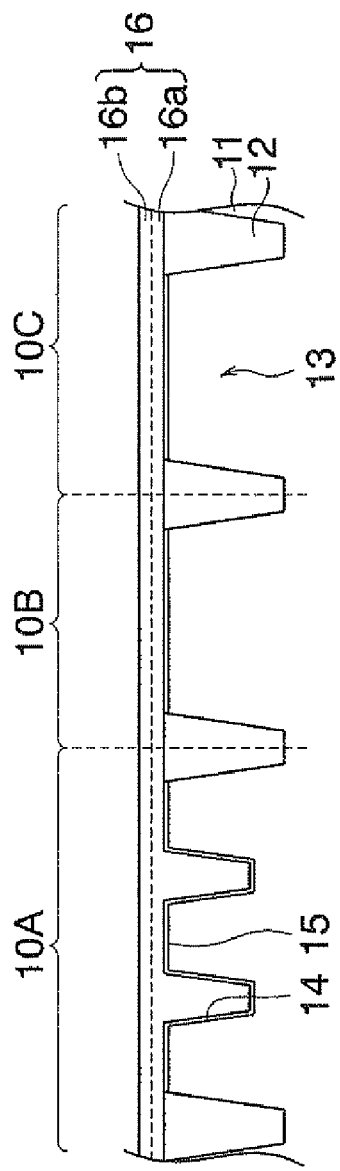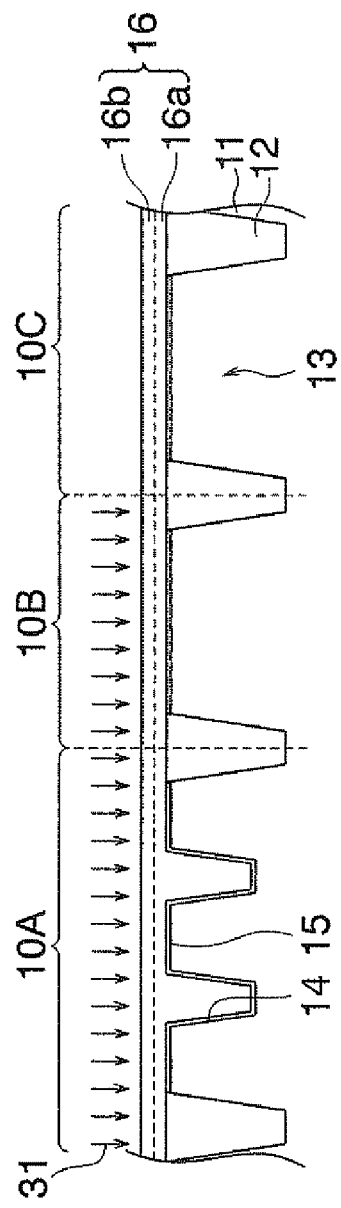

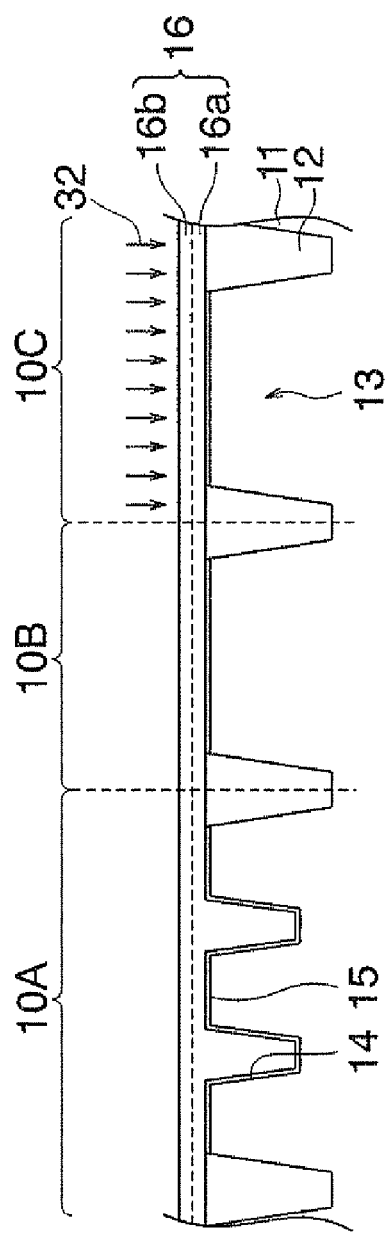
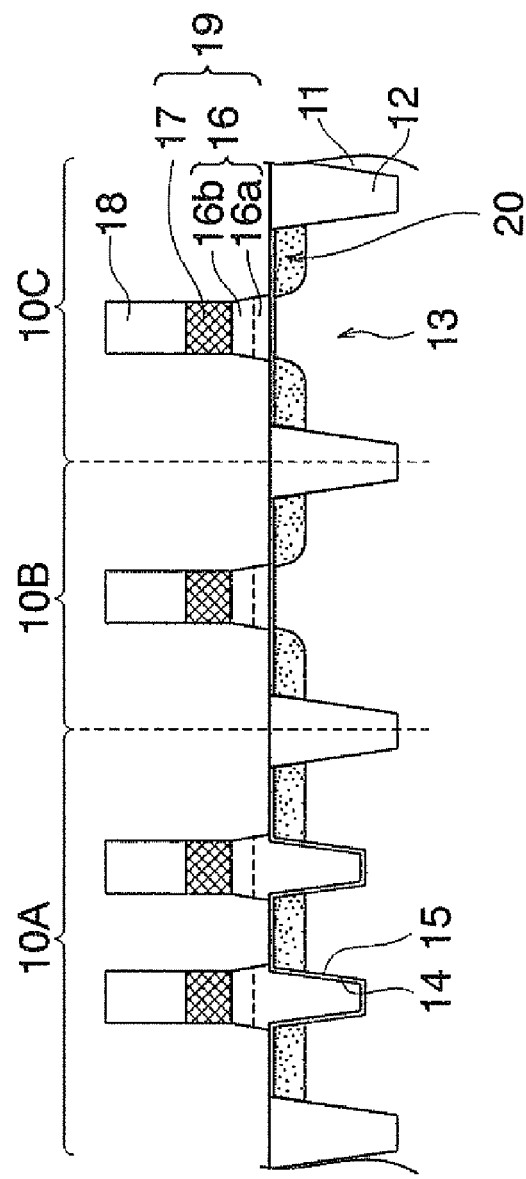

METHOD FOR MANUFACTURING A SEMICONDUCTOR DEVICE HAVING A DOPED SILICON FILM

This application is based upon and claims the benefit of priority from Japanese patent application No. 2006-169765, the disclosure of which is incorporated herein in its entirety by reference.

BACKGROUND OF THE INVENTION (a) Field of the Invention

The present invention relates to a method for manufacturing a semiconductor device and, more particularly, to a method for manufacturing a semiconductor device having a doped silicon film.

(b) Description of the Related Art

A DRAM (dynamic random access memory) device generally includes a memory cell array area wherein a plurality of memory cells are arranged in a two-dimensional array, and a peripheral circuit area wherein a peripheral circuit for driving the memory cells is disposed. The memory cells each include a MOSFET formed on a surface region of a silicon substrate, and a capacitor connected to the MOSFET for storing therein electric charge or data. In general, the electric charge stored in the capacitor gradually reduces due to the junction leakage current as the time elapses. Thus, the DRAM device operates refreshing the data by restoring the electric charge in the capacitor after reading the stored electric charge within the time interval specified for read out of the electric charge.

In the DRAM device installed in an electronic equipment, especially in a portable electronic equipment, it is ever desired to reduce the power dissipation to extend the battery life for the electronic equipment. For this purpose, it is preferable to reduce the power source voltage of the electronic equipment, and to improve the data retention capability of the memory cells for increasing the time interval between refreshing operations which consume a larger amount of power.

A literature presented on "Symposium on VLSI Technology", pp 11-12, 2003 describes a RCAT device or recessed-channel MOSFET for improving the data retention capability of the memory cells including the MOSFET. The recessed-channel MOSFET is a specific MOSFET including a gate electrode made of silicon, which is received in a recess formed in a surface region of the silicon substrate.

In the recessed-channel MOSFET, a U-character channel is formed along the surface of the recess, whereby a larger channel length is obtained even in a semiconductor device manufactured with a smaller design rule. The recessed-channel MOSFET achieves a specific threshold voltage for a channel having an impurity concentration lower than that for the channel of a planar MOSFET. This allows the recessed-channel MOSFET to have a lower electric field across the p-n junction, thereby reducing the junction leakage current to improve the data retention capability of the memory cells.

In a process for manufacturing the recessed-channel MOSFET, the recess is formed in the surface region of the silicon substrate, followed by deposition of a silicon electrode film on the silicon substrate including the internal of the recess via the gate insulation film. The silicon electrode film is doped with a dopant or impurities by ion implantation and then subjected to patterning thereof to form gate electrodes. A heat treatment is then conducted to diffuse the dopant within the gate electrodes for activation of the dopant, thereby obtaining the gate electrodes having a higher electric conductivity.

On the other hand, it is desired to allow MOSFETs formed in the peripheral circuit area to have a smaller channel length for achieving a higher operational speed. Thus, planar cell array transistors (planar MOSFETs) are preferably used as the MOSFETs in the peripheral circuit area.

The inventor analyzed the process for manufacturing the recessed-channel MOSFETs in the memory cell array area and planar MOSFETs in the peripheral circuit area. In order for improving the through-put of the process for the DRAM device, it is preferable to conduct ion-implantation of the silicon electrode film in the recessed-channel MOSFETs and is the silicon electrode film in the planar MOSFETs in the peripheral circuit area in a single step, if both the silicon electrode films includes specific conductivity-type impurities, i.e, p-type or n-type dopant.

However, the single implantation step has a problem in that the acceleration energy of the ion-implantation of the silicon electrode film in the peripheral circuit area should be adapted to a smaller thickness of the silicon electrode film therein, although the silicon electrode film of the recessed-channel MOSFETs have a larger thickness. The smaller acceleration energy adapted to a smaller thickness of the silicon electrode film cannot allow the impurities to be well diffused within the depth of the bottom surface of the silicon electrode film in the memory cell array area. This situation is schematically shown in FIG. 3, wherein the character "P" represents phosphor (P) atoms (ions) and that the number of characters "P" indicates the impurity concentration at respective depths of the silicon electrode film in the recessed-channel MOSFETs. FIG. 3 reveals that a portion of a larger depth has a lower impurity concentration. FIG. 4 shows the impurity profile in the structure shown in FIG. 3 plotted on the vertical plane taken along IV-IV line in FIG. 3.

The lower impurity concentration near the bottom of the silicon electrode film 16 causes depletion of the gate electrodes during operation of the recessed-channel MOSFETs, thereby reducing the ON-current of the MOSFETs and degrades the operational speed of the DRAM device.

For suppressing the insufficient impurity concentration near the bottom of the recess 14 in FIG. 3, it may be considered to perform in-situ doping during deposition of the silicon electrode film 16. In this case, if the silicon electrode film includes n-type impurities such as "P" due to the in-situ doping, it is necessary to dope the n-type silicon electrode film deposited in the PMOS region, which has an n-type conductivity, with a p-type dopant such as "B" to have a p-type conductivity opposite to that of the original PMOS region, as shown in FIG. 5.

The inversion of the conductivity type should be performed to implant the silicon electrode film with the p-type impurity atoms in number which is well larger than the number of n-type impurity atoms introduced during the in-situ doping, as shown in FIG. 5. In FIG. 5, "P" denotes phosphorous ions and "B" denotes boron ions. The larger number of p-type impurity atoms, "B", introduced in the ion-implantation may cause the problem of diffusion of the p-type impurity atoms toward the silicon substrate 11, as depicted by "B" placed in the channel region in FIG. 5. This causes a change or variation of threshold voltage of the MOSFETs.

SUMMARY OF THE INVENTION

In view of the above problems in the conventional technique, it is an object of the present invention to provide a method for manufacturing a semiconductor device having a doped silicon film, which is capable of implanting a silicon film with a sufficient dosage near the bottom thereof.

The present invention provides a method for manufacturing a semiconductor device including: consecutively depositing a doped silicon layer doped with a first-conductivity-type dopant and a non-doped silicon layer to form a layered silicon film overlying a silicon substrate, the silicon substrate including a first region and a second region; implanting a first-conductivity-type dopant into a portion of the layered silicon film in the first region; implanting a second-conductivity-type dopant into a portion of the layered silicon film in the second region; and heat treating the layered silicon film to form a first-conductivity-type silicon film in the first region and a second-conductivity-type silicon film in the second region.

The above and other objects, features and advantages of the present invention will be more apparent from the following description, referring to the accompanying drawings.

BRIEF DESCRIPTION OF THE DRAWINGS

FIGS. 1A to 1E are sectional views of a semiconductor device in consecutive steps of fabrication thereof.

PREFERRED EMBODIMENT OF THE INVENTION

Figure 2A:
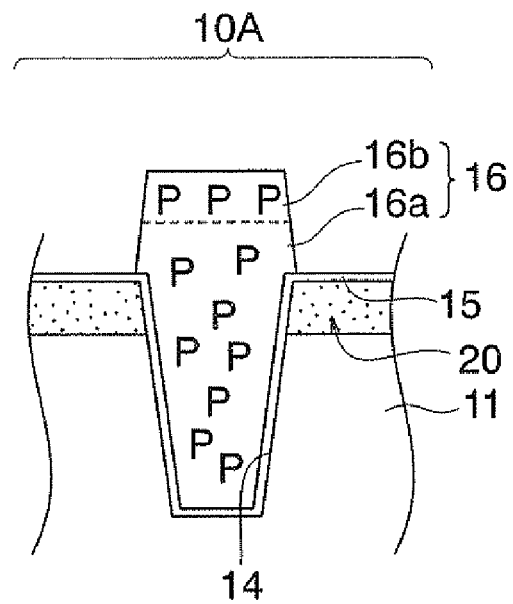
FIGS. 2A to 2C are enlarged sectional views of the semiconductor device at a step in the memory cell array area, NMOS region and PMOS region, respectively.

Now, an exemplary embodiment of the present invention will be described with reference to accompanying drawings, wherein similar constituent elements are designated by similar reference numerals throughout the drawings.

FIGS. 1A to 1E are sectional views of a semiconductor device, consecutively showing the steps of a fabrication process thereof. On a silicon substrate 11, there are provided a memory cell array area 10A receiving therein a plurality of memory cells arranged in a two-dimensional array, and a peripheral circuit area provided in the peripheral area of the silicon substrate 11 and receiving therein a peripheral circuit for driving the memory cells.

In each of FIGS. 1A to 1E, a specific region receiving therein two memory cells sharing a common source is depicted in the memory cell array area 10A, an NMOS region 10B receiving therein an NMOSFET of a CMOSFET and a PMOS region 10C receiving therein a PMOSFET of the CMOSFET are depicted in the peripheral circuit area.

In the fabrication process, a STI (shallow-trench-isolation) structure 12 is first formed in a surface region of a silicon substrate 11 to isolate element forming regions from one another. Subsequently, a known ion-implantation process is conducted to implant impurities or dopant into the element forming regions to form therein a well 13. The threshold voltage of the MOSFET is generally controlled by controlling the impurity concentration of the well 13.

Thereafter, a known dry etching process is conducted to etch the silicon substrate 11 in the memory cell array area 10A to thereby form recesses 14 having a depth of about 150 nm. The width of the recesses 14 depends on the design rule and may be set at 60 nm, in this example. Subsequently, a gate insulation film 15 having a thickness of around 6 nm is formed using a known oxidation technique, for example.

Thereafter, a CVD process is conducted to deposit a lower layer 16a of the silicon electrode film 16 up to a thickness of 30 nm to embed the recesses 14, as shown in FIG. 1A. The deposition of the lower layer 16a uses in-situ doping of n-type impurities, such as phosphor, with a high concentration. Subsequently, an upper layer 16b of the silicon electrode film 16 is deposited using a CVD technique up to a thickness of 40 nm, for example. Thus, the silicon electrode film 16 has a thickness of around 70 nm as viewed from the top surface of the silicon substrate 11, and has a relatively flat top surface, as shown in FIG. 1B. The deposition of the lower layer 16a does not introduce a dopant therein.

The lower layer 16a and upper layer 16b of the silicon electrode film 16 may be deposited sequentially with or without a break in a single deposition chamber, or may be performed separately in different deposition chambers. In this example, a polysilicon film is deposited as the silicon electrode film 16. However, an amorphous silicon film may also be deposited as the silicon electrode film 16.

Thereafter, a known photolithographic and ion-implantation technique is used to introduce phosphor as n-type impurities into the silicon electrode film 16 in the memory cell array area 10A and the NMOS region 10B, as shown by numeral 31 in FIG. 1C. The dosage of the n-type impurities is $5 \times 10^{15}$ cm$^{-2}$, for example. In this ion-implantation, the acceleration energy is determined so that the n-type impurities stay within the silicon electrode film 16 and do not reach the channel region in the silicon substrate 11. The phosphor may be replaced by arsenic. The acceleration energy is preferably set at 10 keV or lower is for the case of phosphor and the thickness of the silicon electrode film 16 being 70 nm.

Thereafter, a known photolithographic and ion-implantation technique is used to introduce boron as p-type impurities into the PMOS region 10C, as shown by numeral 32 in FIG. 1D. The dosage of the p-type impurities is determined so that the total number of p-type impurity atoms (ions) exceeds the total number of n-type impurity atoms (ions) introduced in the silicon electrode film in the PMOS region 10C. The dosage of the p-type impurities is $2 \times 10^{15}$ cm$^{-2}$, for example. In this ion-implantation, the acceleration energy is determined so that the p-type impurities stay within the silicon electrode film 16 and do not reach the channel region in the silicon substrate 11. The boron may be replaced by BF$_2$ or indium. The acceleration energy is preferably set at 5 keV or lower for the case of boron and the thickness of the silicon electrode film 16 being 70 nm.

Thereafter, a metallic film, e.g., tungsten film 17 is deposited on the silicon electrode film 16, followed by deposition of a silicon nitride film thereon. The silicon nitride film is patterned by a known photolithographic and dry etching technique to form top protective films 18. Subsequently, the top protective films 18 are used as a hard mask to etch the tungsten film 17, silicon electrode film 16 and gate insulation film 15 to form gate electrodes 19.

Thereafter, a known photolithographic and ion-implantation technique is used to introduce n-type impurities into the surface region of the silicon substrate 11 exposed from the top protective films 18 and gate electrodes 19 in the memory cell array area 10A and the NMOS region 10B. Subsequently, p-type impurities are introduced in the surface region of the silicon substrate 11 exposed from the top protective films 18 and gate electrodes 18 in the PMOS region 10C. Further, a heat treatment is conducted to diffuse the impurities introduced in the silicon electrode film 16 and the surface region of the silicon substrate 11. In this heat treatment, the impurities introduced in the surface region of the substrate 11 by the ion-implantation are diffused to form source/drain diffused regions 20.

Figure 2B:
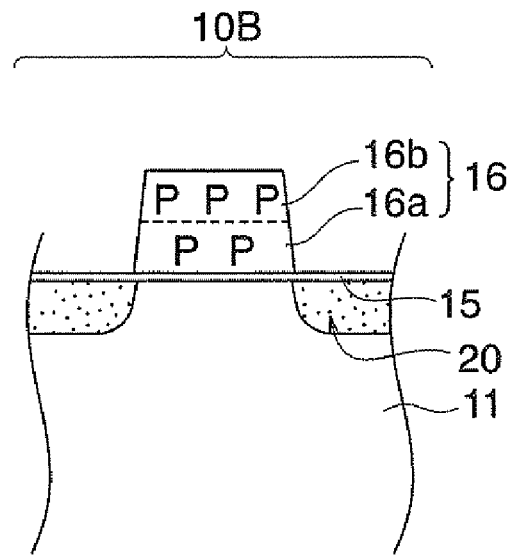

The n-type impurities introduced in the silicon nitride layer 16 in the memory cell array area 10A and NMOS region 10B are also diffused by the above heat treatment. FIGS. 2A and 2B show the situation of this diffusion in the memory cell array area 10A and NMOS region 10B, respectively. As shown in these drawings, phosphorous atoms (P) are diffused substantially uniformly within the gate electrodes 16 including the lower layer 16a and upper layer 16b.

Figure 2C:
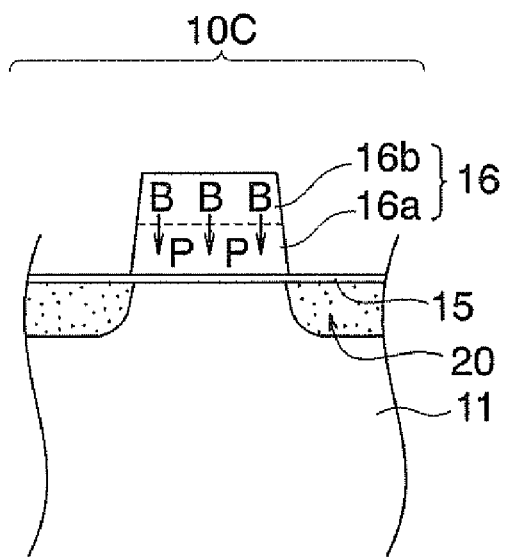
Figure 3:
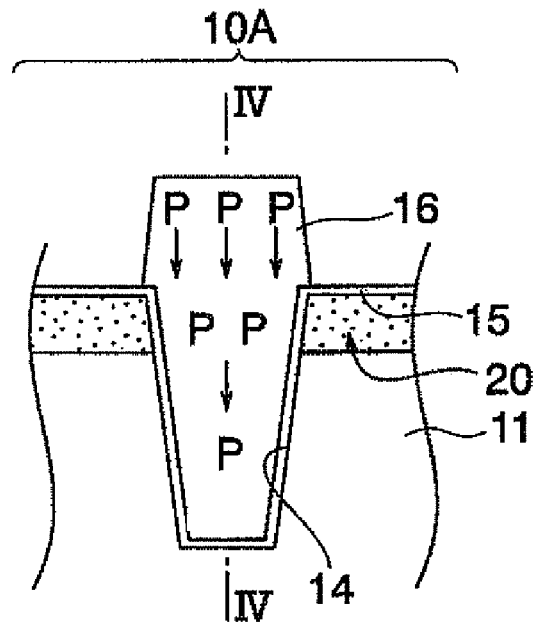
FIG. 3 is a sectional view of a conventional recessed-channel MOSFET for showing the profile of the impurity concentration of the silicon electrode film in the recessed gate electrode.
Figure 4:
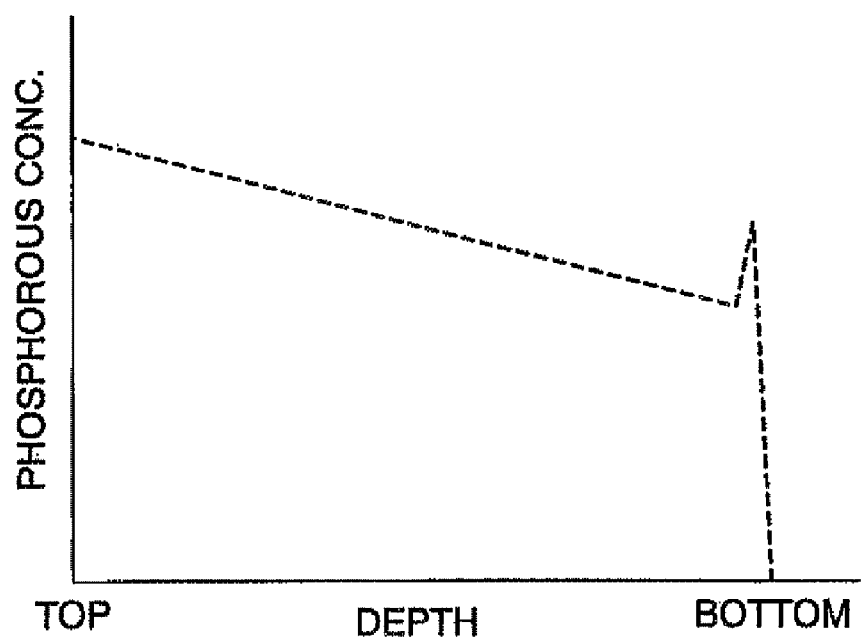
FIG. 4 is a graph showing the impurity concentration profile on the plane taken along IV-IV line in FIG. 3.
Figure 5:
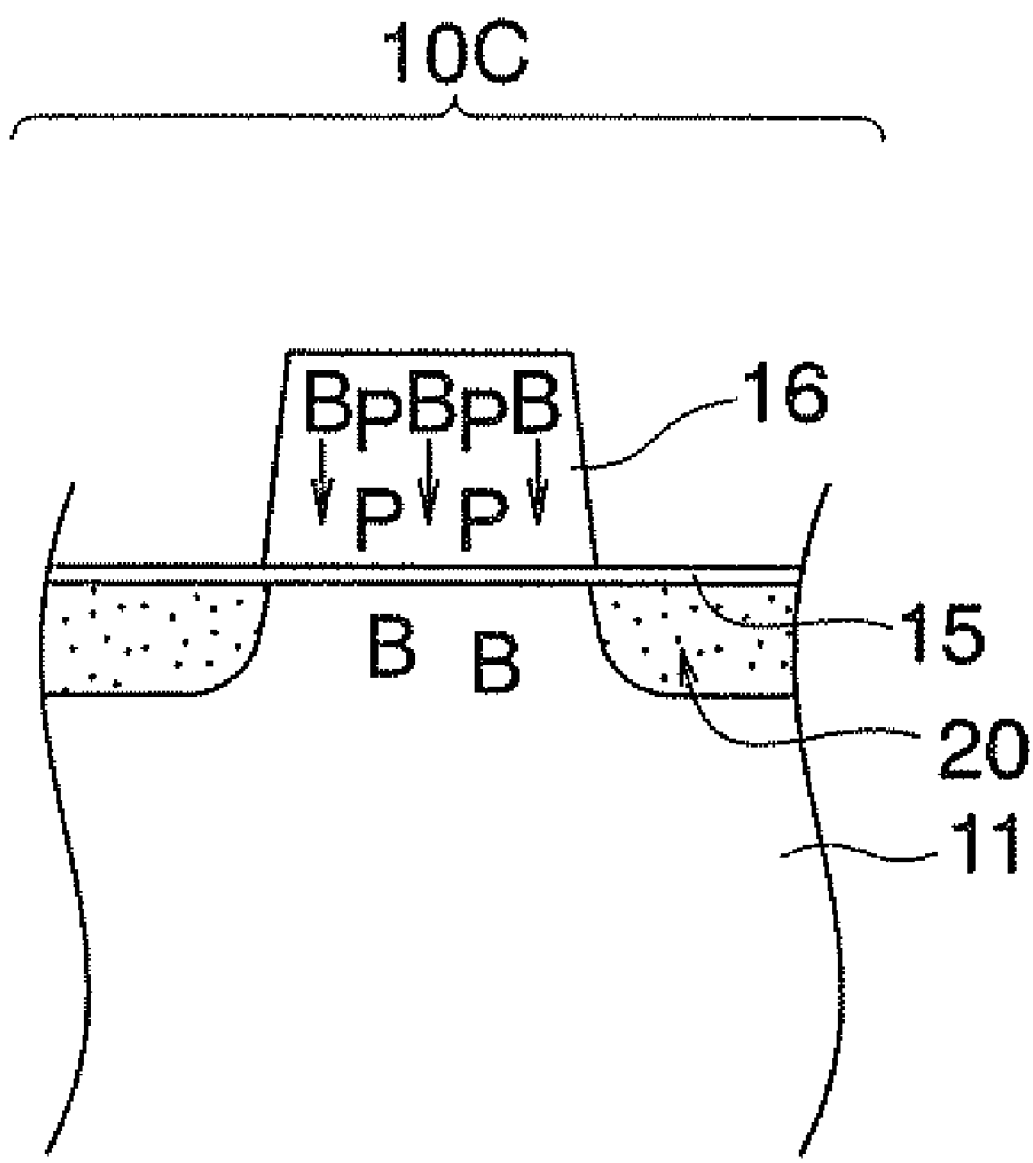
FIG. 5 is a sectional view of a conventional recessed-channel MOSFET in the step corresponding to the step of FIGS. 2A to 2C.

FIG. 2C also shows the situation of the impurities in the silicon electrode film 16 in the PMOS region 10C after the above heat treatment. It is to be noted that, in the PMOS region 10C, the p-type impurities, i.e., boron atoms (B), are introduced in number larger than the number of n-type impurities, i.e., phosphorous atoms (P) introduced in the lower layer 16a of the silicon electrode film 16. Thus, the implanted boron atoms are diffused by the heat treatment uniformly in the silicon electrode film 16 including the lower layer 16a and upper layer 16b, thereby allowing the silicon electrode film 16 to have a suitable p-type conductivity. By limiting the number of total p-type atoms (B) within a suitable range, the p-type impurities are prevented from diffusing toward the channel of the silicon substrate 11 by the heat treatment, as depicted in FIG. 2C.

The silicon electrode film 16 is recrystallized in the heat treatment, whereby gate electrodes are obtained having a poly-metal structure in which the gate electrodes include a top tungsten film 17 at the top and a doped polysilicon film 16 at the bottom. The gate electrodes 19 and associated source/drain diffused regions configure MOSFETs. The MOSFETs formed in the memory cell array area 10A configure recessed-channel MOSFETs having a recessed gate electrode, whereas the MOSFETs formed in the peripheral circuit area configure planar MOSFETs having a gate electrode formed on top of the flat silicon substrate 11, as shown in FIG. 1E.

Thereafter, a sidewall protective film is formed on each side of the gate electrodes 19, followed by deposition of an interlevel dielectric film on the top protective film 18, sidewall protective film and silicon substrate 11. Contact plugs which penetrate through the interlevel dielectric film and the gate insulation film 15 are formed to reach the source/drain regions 20, followed by forming interconnection layers and capacitors connecting to the contact plugs. Thus, a semiconductor device is obtained.

In the method of the above exemplary embodiment, the in-situ doping with the n-type to impurities during deposition of the lower layer 16a of the silicon electrode film prevents an insufficient impurity concentration in the bottom portion of the gate electrodes 19 within the recess 14. In addition, the NMOSFETs formed in the NMOS region 10B of is the peripheral circuit area also have a gate electrode with a sufficient impurity concentration near the bottom thereof. Thus, all the NMOSFETs formed in the memory cell array area and peripheral circuit area have a gate electrode which is less liable to occurring of depletion during operation of the NMOSFETs, thereby achieving a higher ON current therein.

Deposition of the upper layer 16b of the silicon electrode film 16 without using an in-situ doping reduces the number of total n-type atoms introduced in the silicon electrode film, thereby reducing the number of p-type atoms to be introduced in the silicon electrode film 16 to form p-type gate electrodes in the PMOS region 10C. This suppresses occurrence of depletion in the silicon electrode film in the PMOS region 10C, and prevents diffusion of the p-type atoms toward the channel of the silicon substrate 11 to suppress a change of the threshold voltage of the resultant PMOSFETs.

In the above exemplary embodiment, phosphor is used as the n-type dopant of the silicon electrode film; however, the phosphor may be replaced by arsenic or gallium. Similarly, although boron is used as the p-type dopant of the silicon electrode film in the PMOS region 10C in the above exemplary embodiment, the boron may be replaced by $BF_2$ or indium. Further, the conductivity type in the above exemplary embodiment may be reversed, by forming the silicon electrode film in the memory cell array area 10A to have a p-type conductivity. The silicon film may be a general silicon film and not limited to the silicon electrode film in the present invention.

In the conventional technique, the silicon electrode film in the PMOS region of the peripheral circuit area generally has an n-type conductivity, and the channel of the PMOSFETs is formed within a recess formed in the surface region of the silicon substrate, similarly to the memory cell array area. This configuration, however, may cause a higher threshold voltage of the MOSFETs due to the difference in the work function between the silicon substrate 11 and the silicon electrode film 16. The recessed-channel PMOSFETs generally have a threshold voltage of around 0.7 volt.

On the other hand, in the exemplary embodiment of the present invention, the silicon electrode film in the PMOS region has a p-type conductivity, and the PMOSFET is of a planar type wherein the channel is formed as a surface channel in the silicon substrate. This configuration reduces the difference in the work function as described above and thus allows the threshold voltage to be reduced down to as low as around 0.3 volt. It is to be noted that an up-to-date logic semiconductor device has a PN-dual-gate structure wherein the silicon electrode film in the PMOS region has a p-type conductivity and the silicon electrode film in the NMOS region has an n-type conductivity, and is manufactured by using a so-called PN-dual-gate process.

As described above, in accordance with the exemplary embodiment of the present invention, the in-situ deposing of the lower layer of the silicon film prevents an insufficient impurity concentration near the bottom of the silicon film. The non-doped upper layer of the silicon layer deposited on the lower layer restricts the number of impurity atoms introduced in the entire silicon film. This reduces the number of impurity atoms needed for inverting the conductivity type of a portion of the silicon film. The smaller number of impurity atoms for inverting the conductivity type prevent occurring of depletion in the portion, and prevent diffusion of the impurity atoms toward the silicon substrate.

The step of depositing the silicon electrode film in the above embodiment may be conducted after forming a recess in the surface region of the silicon substrate. At least a portion of the lower layer is received in the recess, whereas the upper layer may be formed outside the recess. The lower layer doped by in-situ doping and received in the recess may prevent occurring of depletion of the silicon layer.

The lower layer of the silicon film may have a thickness larger than half the minimum width of the recess. This thickness of the lower layer prevents an insufficient impurity concentration within the recess.

The step of depositing a metallic film on the silicon film may be conducted before or after the heat treatment for diffusion of the impurity atoms in the silicon film. The inherent lower resistance of the metallic film formed on the silicon layer provides a higher speed of the signal propagation.

While the invention has been particularly shown and described with reference to exemplary embodiment thereof, the invention is not limited to the above embodiment. It will be understood by those of ordinary skill in the art that various changes in form and details may be made therein without departing from the spirit and scope of the present invention as defined in the claims.

What is claimed is:

1. A method for manufacturing a semiconductor device comprising:

consecutively depositing a doped silicon layer doped with a first-conductivity-type dopant and a non-doped silicon layer to form a layered silicon film overlying a silicon substrate, said silicon substrate including a first region and a second region;

implanting a first-conductivity-type dopant into a portion of said layered silicon film in said first region;

implanting a second-conductivity-type dopant into a portion of said layered silicon film in said second region; and heat treating said layered silicon film to form a first-conductivity-type silicon film in said first region and a second-conductivity-type silicon film in said second region.

2. The method according to claim 1, further comprising, before said depositing, forming a recess in said first region of said silicon substrate, wherein said depositing deposits said doped silicon layer and said non-doped silicon layer on said silicon substrate including an internal of said recess, and said non-dope silicon film has a substantially flat top surface.

3. The method according to claim 2, wherein said doped silicon layer has a thickness larger than half a minimum width of said recess.

4. The method according to claim 1, further comprising depositing a metallic film on said layered silicon film before or after said heat treatment.

5. The method according to claim 4, further comprising patterning said layered silicon film and said metallic film to form a gate electrode of a MOSFET.

* * * * *